(12) United States Patent
Beom et al.

(10) Patent No.: US 9,362,526 B2
(45) Date of Patent: Jun. 7, 2016

(54) DISPLAY DEVICE AND METHOD OF MANUFACTURING THE SAME

(71) Applicant: Samsung Display Co., Ltd., Yongin, Dyeonggi-Do (KR)

(72) Inventors: Jin Gab Beom, Cheonan-si (KR); Dae Guen Choi, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/279,517

(22) Filed: May 16, 2014

(65) Prior Publication Data

US 2015/0069345 A1 Mar. 12, 2015

(30) Foreign Application Priority Data

Sep. 11, 2013 (KR) .................. 10-2013-0109365

(51) Int. Cl.
 *H01L 21/00* (2006.01)
 *H01L 51/52* (2006.01)
 *H01L 51/00* (2006.01)
(52) U.S. Cl.
 CPC ........ *H01L 51/5253* (2013.01); *H01L 51/0024* (2013.01); *H01L 51/0097* (2013.01); *Y02E 10/549* (2013.01)

(58) Field of Classification Search
 None
 See application file for complete search history.

(56) References Cited

U.S. PATENT DOCUMENTS

| | | | | |
|---|---|---|---|---|
| 2003/0184704 | A1* | 10/2003 | Akiyama et al. | ............... 349/158 |
| 2005/0168491 | A1* | 8/2005 | Takahara et al. | ............... 345/690 |
| 2005/0230804 | A1* | 10/2005 | Tanida et al. | .................. 257/690 |
| 2014/0217486 | A1* | 8/2014 | Akiyama | .......... H01L 27/14632 257/294 |

FOREIGN PATENT DOCUMENTS

| | | | |
|---|---|---|---|
| KR | 1020050017324 A | 2/2005 | |
| KR | 1020060088147 A | 8/2006 | |
| KR | 1020060105107 A | 10/2006 | |
| KR | 1020080033820 A | 4/2008 | |
| KR | 1020110139892 A | 12/2011 | |

* cited by examiner

*Primary Examiner* — Calvin Choi
(74) *Attorney, Agent, or Firm* — Cantor Colburn LLP

(57) ABSTRACT

A display device includes a substrate, a device layer on a front side of the substrate, and a protection sheet on a rear side of the substrate opposite to the front side of the substrate. The protection sheet comprises polytetrafluoroethylene.

17 Claims, 2 Drawing Sheets

DISPLAY DEVICE AND METHOD OF MANUFACTURING THE SAME

This application claims priority to Korean Patent Application No. 10-2013-0109365 filed on Sep. 11, 2013, and all the benefits accruing therefrom under 35 U.S.C. §119, the entire contents of which are incorporated herein by reference.

BACKGROUND

1. Field

A display device and a method of manufacturing the same are disclosed.

2. Description of the Related Art

Display devices include a liquid crystal display ("LCD"), a plasma display panel ("PDP"), an organic light emitting diode display ("OLED"), a field effect display ("FED"), an electrophoretic display device, and the like.

A display device includes a substrate, and a device layer disposed thereon.

The substrate of the display device may include a glass substrate or a plastic substrate. The plastic substrate has drawn more attention due to flexibility tendency of a display device.

The device layer of the display device is divided into a display area portion and a driving area portion. A driving integrated circuit of the driving area portion is mounted on the substrate, such as by using a conventional thermal compression method.

SUMMARY

One or more exemplary embodiment provides a display device in which deformation or transformation thereof due to thermal compression is reduced or effectively prevented, and a fine pitch of a component thereof is realized.

One or more exemplary embodiment provides a method of manufacturing the display device.

According to an exemplary embodiment, a display device includes a substrate, a device layer on a front side of the substrate and protection sheet on a rear side of the substrate. The protection sheet includes polytetrafluoroethylene.

The protection sheet may have an elongation rate of less than or equal to about 200%.

The protection sheet may have a thickness of about 5 micrometers (µm) to about 300 µm.

The substrate may include polyimide.

The substrate includes a display area and a non-display area. The device layer includes a driving area portion in the non-display area of the substrate. The driving area portion of the device layer includes a first member layer, and a second member layer on the first member layer. The second member layer may include a chip-on-film ("COF"), a chip-on-glass ("COG"), a flexible printed circuit board ("FPCB") or a tape carrier package ("TCP").

The second member layer may have a pattern having a pitch of about 20 µm to about 40 µm.

The display device may further include an adhesion layer between the substrate and the protection sheet.

The adhesion layer may include silicon.

The adhesion layer may have a thickness of about 5 µm to about 150 µm.

The display device may be an organic light emitting device.

According to another exemplary embodiment, a method of manufacturing a display device includes preparing a substrate, forming a device layer on a front side of the substrate, and forming a protection sheet including polytetrafluoroethylene, on a rear side of the substrate.

The forming the protection sheet may include laminating the protection sheet on the rear side of the substrate.

The forming the device layer may include thermally compressing the device layer on the front side of the substrate, while the protection sheet is on the rear side of the substrate.

The thermally compressing the device layer may include a process of outer lead bonding ("OLB").

The thermally compressing the device layer may be performed at a temperature from about room temperature to about 250 degrees Celsius (° C.).

The method may further include forming an adhesion layer between the substrate and the protection sheet.

Accordingly, since deformation or transformation of the substrate during the thermal compression at a relatively high temperature is reduced or effectively prevented via the protection sheet, the pitch of the second member layer is maintained and a display device realizing a fine pitch of driving members is provided.

BRIEF DESCRIPTION OF THE DRAWINGS

The above and other features of this disclosure will become more apparent by describing in further detail exemplary embodiments thereof with reference to the accompanying drawings in which.

DETAILED DESCRIPTION

Figure 1:
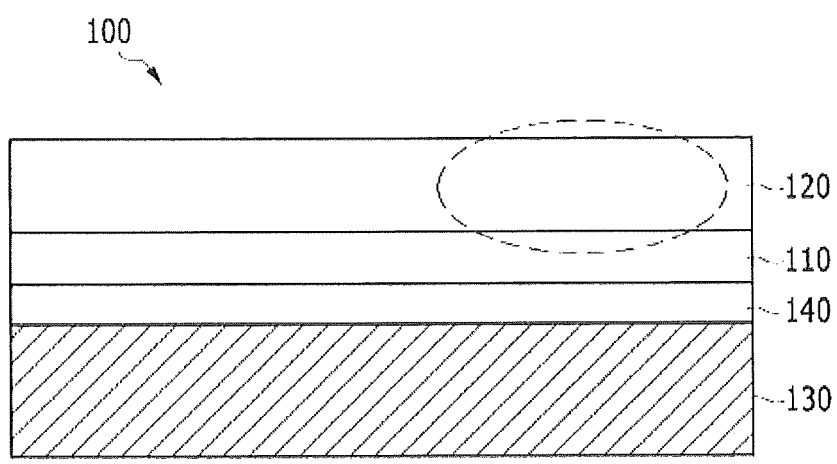
FIG. 1 is a cross-sectional view of an exemplary embodiment of a display device according to the invention.

The invention will be described more fully hereinafter with reference to the accompanying drawings, in which exemplary embodiments of this disclosure are shown. However, this disclosure may be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other. As used herein, the term "and/or" includes any and all combinations of one or more of the associated listed items.

In addition, the drawings are schematically illustrated rather than an exact downscale. Relative dimension and ratio of parts in the drawings are exaggerated or reduced for clarity and convenience and thus, should be regarded to be not limitedly but exemplary.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

When the plastic substrate is included in a flexible display device, and a non-display (driving) area of the display device is thermally compressed in a process of manufacturing the display device, an integrated circuit may not be disposed in the driving area as a desired pattern by the thermal compression, since a plastic is in general sensitive to a temperature. Therefore, there remains a need for an improved display device and method of manufacturing thereof, in which an integrated circuit or other driving component is accurately disposed in the driving area of the display device.

Hereinafter, an exemplary embodiment of a display device according to the invention is illustrated referring to FIGS. 1 and 2.

Figure 2:
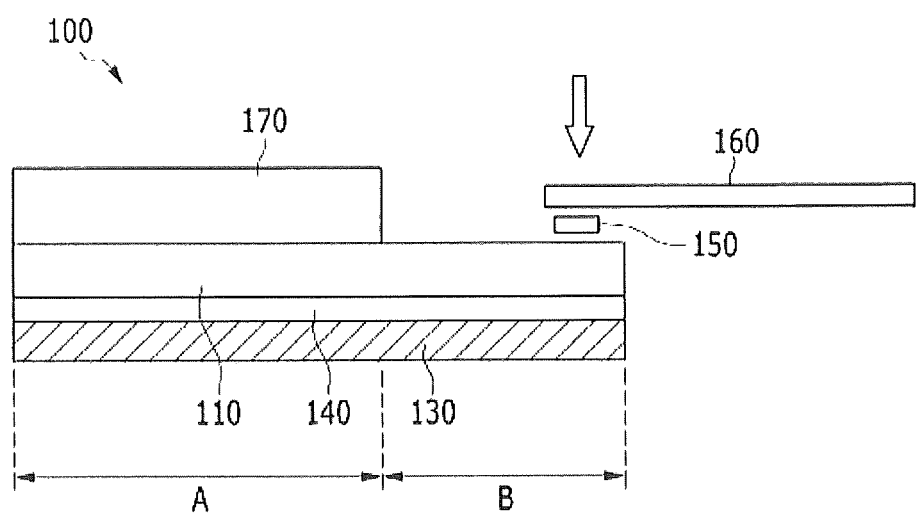
FIG. 2 is an enlarged cross-sectional view of an exemplary embodiment of the portion indicated by the dotted line of FIG. 1.

FIG. 1 is a cross-sectional view showing an exemplary embodiment of a display device according to the invention, and FIG. 2 is an enlarged cross-sectional view of an exemplary embodiment of the portion indicated by the dotted line of FIG. 1.

Referring to FIGS. 1 and 2, an exemplary embodiment of a display device according to the invention includes a substrate 110, a device layer 120 and a protection sheet 130.

The substrate 110 may be a glass substrate or a polymer substrate, but is not limited thereto.

The substrate 110 may include a polymer having relatively high heat resistance, for example, polyimide, polyacrylate, polyethyleneetherphthalate, polyethylenenaphthalate, polycarbonate, polyarylate, polyetherimide, polyethersulfone, tricellulose acetate, polychloride vinylidene, polyvinylidene fluoride, an ethylene-vinylalcohol copolymer, or a combination thereof.

The substrate 110 may include, for example, polyimide. The polyimide has excellent mechanical strength and heat resistance and thus, may reduce or effectively prevent loosening or thermal deformation (or transformation) of the substrate 110 due to a load applied to the substrate 110. In an exemplary embodiment of a process of manufacturing a display device, the above-described substrate 110 is stable even though a subsequent process thereto is performed at a relatively high temperature.

The device layer 120 is disposed on the front side of the substrate 110. The device layer 120 includes a display area portion A in which an active device such as a thin film transistor ("TFT") is disposed and a driving area portion B in which a driving integrated circuit is disposed. The display device including the device layer 120 may have a display area and a non-display (e.g., driving) area corresponding to those portions of the device layer 120, respectively.

A driving area portion B of the device layer 120 includes a first member layer 150 and a second member layer 160.

The first member layer 150 may connect the second member layer 160 to the substrate 110, so that a predetermined pattern of the second member layer 160 may be mounted on the substrate 110. In one exemplary embodiment, for example, the first member layer 150 may include an anisotropic conductive film ("ACF") structure, but is not limited thereto or thereby.

The second member layer 160 may have a predetermined pattern, such as determined in a plan and/or cross-sectional view of the display device. The second member layer 160 having the predetermined pattern may be mounted on the substrate 110. In one exemplary embodiment, for example, the second member layer 160 may include a chip-on-film ("COF"), chip-on-glass ("COG"), flexible printed circuit board ("FPCB") or tape carrier package ("TCP").

The second member layer 160 may have a pattern having a pitch in a range of about 20 micrometers (μm) to about 40 μm. In one exemplary embodiment, the second member layer 160 may have a pattern having a pitch in a range of about 20 μm to about 30 μm. The pitch may be defined as a distance between common points of adjacent pattern portions, such as a distance between edges thereof, between centers thereof, etc. in a plan view of the substrate 110. When the pattern of the second member layer 160 having a pitch within the above-described range is included in a display device, resolution of the display device may be increased.

In an exemplary embodiment of manufacturing a display device, the second member layer 160 may be mounted on the substrate 110 by thermally compressing the front side of the device layer 120, as indicated by the downward arrow in FIG. 2. The thermal compression may be performed, for example, in an outer lead bonding ("OLB") process.

The thermal compression may be performed at a temperature in a range from about room temperature to about 250 degrees Celsius (° C.). In one exemplary embodiment, the thermal compression is performed at a relatively high temperature in a range of about 180° C. to about 250° C.

A display area portion A of the device layer 120 is generally indicated by 170 in FIG. 2. The display area device layer 170 may include, but is not limited to, signal lines, display elements or the like, of the display device 100.

The protection sheet 130 is disposed on an opposing side of the substrate 110 to the side on which the device layer 120 is disposed. The protection sheet 130 may be disposed on a rear side, opposite to the front side, of the substrate 110. The protection sheet 130 may be disposed on substantially an entire of a surface at the rear side of the substrate 110, spanning both the display and non-display areas of the substrate 110, but not being limited thereto or thereby.

As described above, the pattern of the device layer 120 is mounted on the substrate 110 by thermally compressing the front side of the device layer 120 at a relatively high temperature. The protection sheet 130 is disposed on the rear side of the substrate 110 and may reduce or effectively prevent deformation or transformation of the substrate 110 during the thermal compression at the relatively high temperature. Therefore, the pitch of the second member layer 160 is maintained since deformation or transformation of the substrate 110 during the thermal compression at the relatively high temperature is reduced or effectively prevented via the protection sheet 130. Accordingly, a pattern having pitch (e.g., a fine pitch) is formed on the substrate 110.

The protection sheet 130 may have an elongation rate of less than or equal to about 200%. The elongation rate is measured by using a 25 millimeter (mm)*25 mm specimen with a universal testing machine ("UTM") equipment.

The protection sheet 130 may include polytetrafluoroethylene ("PTFE"). The PTFE is a fluorine resin generally known as TEFLON® by Dupont. The display device 100 may have relatively high thermal conductivity and simultaneously a low elongation rate at a relatively high temperature by using the protection sheet 130 including polytetrafluoroethylene on the rear side of the substrate 110. Accordingly, a fine pitch is mounted on the substrate 110, and the display device 100 may have a resolution required of high definition ("HD"), full high definition ("FHD"), and the like.

The protection sheet 130 may be a transparent layer.

The display device may further include an adhesion layer 140 between the substrate 110 and the protection sheet 130.

The adhesion layer 140 may attach the protection sheet 130 to the substrate 110. The adhesion layer 140 may include, for example, an epoxy compound, an acryl compound, a silicon compound or a combination thereof, but is not limited thereto. The adhesion layer 140 may include a silicon material or compound. This adhesion layer 140 may not only improve transmittance of the substrate 110 but also attach the protection sheet 130 to the substrate 110 at room temperature in a process of manufacturing a display device.

The adhesion layer 140 may have a cross-sectional thickness of about 5 μm to about 150 μm. When the adhesion layer 140 has a cross-sectional thickness within the above-described range, adherence of the protection sheet 130 to the substrate 110 may be further improved.

The protection sheet 130 including polytetrafluoroethylene has a relatively low elongation rate at a relatively high temperature such that a fine pattern of the display device 100 may be formed, even though the display device 100 including the protection sheet 130 on the rear side of the substrate 110 is thermally compressed at the relatively high temperature. Accordingly, resolution of the display device 100 may be increased.

The above display device 100 may be an organic light emitting device, but is not limited thereto or thereby.

Hereinafter, a method of manufacturing the display device is illustrated.

An exemplary embodiment of a method of manufacturing a display device according to the invention includes preparing a substrate, forming a device layer on a front side of the substrate and forming a protection sheet including a polytetrafluoroethylene resin on a rear side of the substrate.

In the process of preparing a substrate, the substrate may include, for example, polyimide.

The process of forming a device layer may include formation of a first member layer, and formation of a second member layer on the first member layer.

The process of forming a device layer may include thermally compressing the front side of the device layer, such as where the first and second member layers are disposed on the front side of the substrate. The thermal compression may be performed at about 180° C. to about 250° C. The thermal compression may be performed in an OLB process. Through the thermal compression, a predetermined pattern of the second member layer may be mounted on the substrate via the first member layer.

The process of forming a protection sheet has no particular limit with respect to a method of attaching the protection sheet to the substrate. The process of forming a protection sheet may be performed, for example, by laminating the protection sheet in a form of a film or by coating the protection sheet in a form of a solution, on the rear side of the substrate.

When the protection sheet is formed by coating a solution on the rear side of the substrate, the process of forming the protection sheet may include supplying a polytetrafluoroethylene resin-containing solution on the rear side of the substrate and curing the polytetrafluoroethylene resin-containing solution.

The polytetrafluoroethylene resin-containing solution may further include various additives such as a curing initiator and/or a coupling agent other than the polytetrafluoroethylene resin, and/or a solvent.

The process of supplying the polytetrafluoroethylene resin-containing solution may be performed for example, in a method of spin coating, screen printing, inkjet printing, one drop filling ("ODF"), or a combination thereof.

The method may further include a process of forming an adhesion layer between the substrate and the protection sheet. The adhesion layer may include a material such as an epoxy compound, an acryl compound, a silicon compound or a combination thereof. The material for the adhesion layer in a form of a solution may be supplied on the substrate in a method of, for example, spin coating, screen printing, inkjet printing, ODF or combination thereof.

Hereinafter, the invention is illustrated in more detail with reference to Examples. However, these Examples are exemplary, and the invention is not limited thereto.

Example 1

A polyimide substrate having a thickness of 15 μm was prepared. An adhesion layer having a thickness of 50 μm was formed on the substrate by coating an acryl-based pressure sensitive adhesive ("PSA") on the rear side of the substrate and curing the same.

A 25 μm to 75 μm-thick protection sheet including 25%-75% of polytetrafluoroethylene relative to the entire protection sheet, was laminated on the adhesive layer.

On the front side of the polyimide substrate, a device layer was formed, manufacturing a display device.

Comparative Example 1

A display device was manufactured according to the same method as Example 1 except for using a polyethylene terephthalate ("PET")-based resin for the protection sheet.

Evaluation 1: Measurement of Thermal Conductivity

In the display devices according to Example 1 and Comparative Example 1, thermal conductivity in watts per meter kelvin (W/mK) of the protection sheet was measured. The thermal conductivity was measured by using a thermal conductivity measuring device, quick thermal conductivity meter QTM500 by KYOTO Electronics Manufacturing Co., Ltd., for a 40 mm*100 mm sample of the protection sheet.

The results are shown in Table 1.

TABLE 1

|  | Example 1 | Comparative Example 1 |
| --- | --- | --- |
| Thermal conductivity (W/mk) | 0.2605 | 0.2598 |

Referring to Table 1, the protection sheet sample of Example 1 showed nearly equivalent thermal conductivity to that of Comparative Example 1. Accordingly, the protection sheet of Example 1 did not have deteriorated thermal conductivity with respect to that of the Comparative Example 1.

Evaluation 2: Measurement of Elongation Rate

The display device according to Example 1 and Comparative Example 1, an elongation rate (or ratio) of the protection sheet was measured, as a function the coefficient of thermal expansion ("CTE") and a UTM. The elongation rate was measured by using UTM equipment (Instron® LLC) for about a 25 mm*25 mm sample of the protection sheet.

The results are shown in Table 2.

TABLE 2

|  | Example 1 | Comparative Example 1 |
| --- | --- | --- |
| Elongation rate (CTE/UTM) (%) | 195% | 439.5% |

Referring to Table 2, the protection sheet sample of Example 1 showed a much lower elongation rate than that of Comparative Example 1. Accordingly, the display device according to Example 1 turned out to form a finer pattern than the display device according to Comparative Example 1.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising
a substrate comprising a display area and a non-display area,
a device layer on a front side of the substrate, the device layer comprising a display area portion in the display area of the substrate and a driving area portion in the non-display area of the substrate, and
a protection sheet comprising polytetrafluoroethylene which is on a rear side of the substrate opposite to the front side,
wherein the protection sheet comprising polytetrafluoroethylene which is on the rear side of the substrate overlaps an entirety of the non-display area of the substrate which comprises the display area and the non-display area.

2. The display device of claim 1, wherein the protection sheet comprising polytetrafluoroethylene which is on the rear side of the substrate which comprises the display area and the non-display area has an elongation rate of less than or equal to about 200%.

3. The display device of claim 1, wherein the protection sheet comprising polytetrafluoroethylene which is on the rear side of the substrate which comprises the display area and the non-display area has a thickness of about 5 micrometers to about 300 micrometers.

4. The display device of claim 1, wherein the substrate on the front side of which is disposed the device layer and on the rear side of which is disposed the protection sheet comprising polytetrafluoroethylene, comprises polyimide.

5. The display device of claim 1, wherein the driving area portion of the device layer comprises:
a first member layer, and
a second member layer on the first member layer, and
the second member layer of the driving area portion of the device layer comprises a chip-on-film, a chip-on-glass, a flexible printed circuit board or a tape carrier package.

6. The display device of claim 5, wherein the second member layer has a pattern having a pitch of about 20 micrometers to about 40 micrometers.

7. The display device of claim 1, further comprising an adhesion layer between the substrate and the protection sheet comprising polytetrafluoroethylene which overlaps the driving area portion of the device layer in the non-display area of the substrate.

8. The display device of claim 7, wherein the adhesion layer comprises silicon.

9. The display device of claim 7, wherein the adhesion layer has a thickness of about 5 micrometers to about 150 micrometers.

10. The display device of claim 1, wherein the display device is an organic light emitting device.

11. A method of manufacturing a display device, comprising preparing a substrate comprising a display area and a non-display area,
forming a protection sheet comprising a polytetrafluoroethylene resin, on a rear side of the substrate opposite to a front side thereof opposite to the rear side and overlapping both the display area and the non-display area of the substrate, and
with the protection sheet comprising the polytetrafluoroethylene resin on the rear side of the substrate, forming a device layer on the front side of the substrate, the device layer comprising:
a display area portion in the display area overlapped by the protection sheet comprising the polytetrafluoroethylene resin, and
a driving area portion in the non-display area overlapped by the protection sheet comprising the polytetrafluoroethylene resin.

12. The method of claim 11, wherein the forming the protection sheet comprises laminating the protection sheet on the rear side of the substrate.

13. The method of claim 11, wherein the forming the device layer comprises thermally compressing the driving area portion of the device layer on the front side of the substrate in the non-display area of the substrate, while the protection sheet comprising polytetrafluoroethylene which is on the rear side of the substrate overlaps the driving area portion of the device layer in the non-display area of the substrate which comprises the display area and the non-display area.

14. The method of claim 11, wherein the thermally compressing the device layer comprises an outer lead bonding method.

15. The method of claim 11, wherein the thermally compressing the device layer is performed at a temperature of about room temperature to about 250° Celsius.

16. The method of claim 11, further comprising forming an adhesion layer between the substrate and the protection sheet.

17. The display device of claim 1, wherein the protection sheet comprising polytetrafluoroethylene which overlaps the entirety of the driving area portion of the device layer in the non-display area of the substrate, extends to overlap the display area portion of the device layer in the display area of the substrate.

* * * * *